United States Patent [19]

Fukumura et al.

[11] Patent Number: 4,611,181

[45] Date of Patent: Sep. 9, 1986

[54] TEMPERATURE COMPENSATED OSCILLATOR WITH REDUCED NOISE

[75] Inventors: Yukio Fukumura; Takashi Matsuura, both of Tokyo, Japan

[73] Assignee: NEC Corporation, Tokyo, Japan

[21] Appl. No.: 772,148

[22] Filed: Sep. 3, 1985

[30] Foreign Application Priority Data

Sep. 10, 1984 [JP] Japan .................................. 59-189138

[51] Int. Cl.⁴ .............................................. H03L 1/02
[52] U.S. Cl. ......................................... 331/66; 331/176
[58] Field of Search ...................... 331/66, 69, 70, 176; 219/209, 210; 73/766, 497; 364/557, 571, 574

[56] References Cited

U.S. PATENT DOCUMENTS 3,713,033 1/1973 Frerking ......................... 331/176 X
3,719,838 3/1973 Peduto et al. .................... 331/176 X

FOREIGN PATENT DOCUMENTS 0184809 10/1983 Japan .

Primary Examiner—Eugene R. LaRoche
Assistant Examiner—D. C. Mis
Attorney, Agent, or Firm—Laff, Whitesel, Conte & Saret

[57] ABSTRACT

A temperature-compensated oscillator avoids noise heretofore caused by unduly high signal level changes of a control voltage resulting from sensed temperature changes. This is done by reducing the high level changes into a plurality of relatively low level changes which produce a cumulative effect comparable to the high level effect. The many low level changes do not produce reactions which are abrupt enough to cause noise, especially a phase modulation or frequency modulation noise.

9 Claims, 9 Drawing Figures

TEMPERATURE COMPENSATED OSCILLATOR WITH REDUCED NOISE

BACKGROUND OF THE INVENTION

The present invention relates to a temperature-compensated oscillation device and, more particularly, to a digitally controlled temperature-compensated oscillation device.

A digitally controlled, temperature-compensated oscillation device has been extensively used as a local oscillator of a mobile radio apparatus because its frequency generally remains stable over a wide temperature range. Such a type of oscillation device comprises a temperature sensing section including a temperature sensor and an analog-to-digital (AD) converter, a read only memory (ROM) which stores compensation data associated with outputs of the AD converter, and an oscillating section responsive to an output of the ROM and comprising a digital-to-analog (DA) converter and a voltage controlled oscillator (VCO).

The problem with an oscillation device having the above construction is that a noticeable variation in ambient temperature causes an output of the AD converter, i.e., an output value of the ROM, to vary sharply for a moment to add frequency modulation noise and phase modulation noise to an output of the VCO. In a multichannel communication system, these noises constitute a source of noise for other channels. That noise on other channels requires the exclusive frequency band to have an undesirable width.

SUMMARY OF THE INVENTION

It is, therefore, an object of the present invention to provide a digitally controlled, temperature-compensated oscillation device which reduces the previously mentioned kinds of noise.

A temperature-compensated oscillator device to which the present invention is applicable, comprises temperature sensing section means including temperature sensor means for sensing an ambient temperature. A temperature data signal is provided which is representative of the sensed temperature. An analog-to-digital converter means converts the temperature data signal to a first digital signal having a first digital value. A control section means converts the first digital signal into a second digital signal having a second digitial value. An oscillating section means includes converter means for converting the second digital signal into a frequency control signal and voltage-controlled oscillator means responsive to the frequency control signal for changing the oscillation signal frequency. According to the present invention, the control section means comprises first means for converting a variation in the first digital value to a plurality of time-divided fractional variations in the second digital value.

BRIEF DESCRIPTION OF THE DRAWINGS

The above and other objects, features and advantages of the present invention will become more apparent from the following detailed description taken with the accompanying drawings in which:

FIG. 2A shows an oscillation signal frequency variation against ambient temperature characteristic, FIG. 2B shows an oscillation signal frequency variation against frequency control signal characteristic, and FIG. 2C shows a frequency control signal against ambient temperature characteristic;

DETAILED DESCRIPTION OF THE INVENTION

Figure 1:
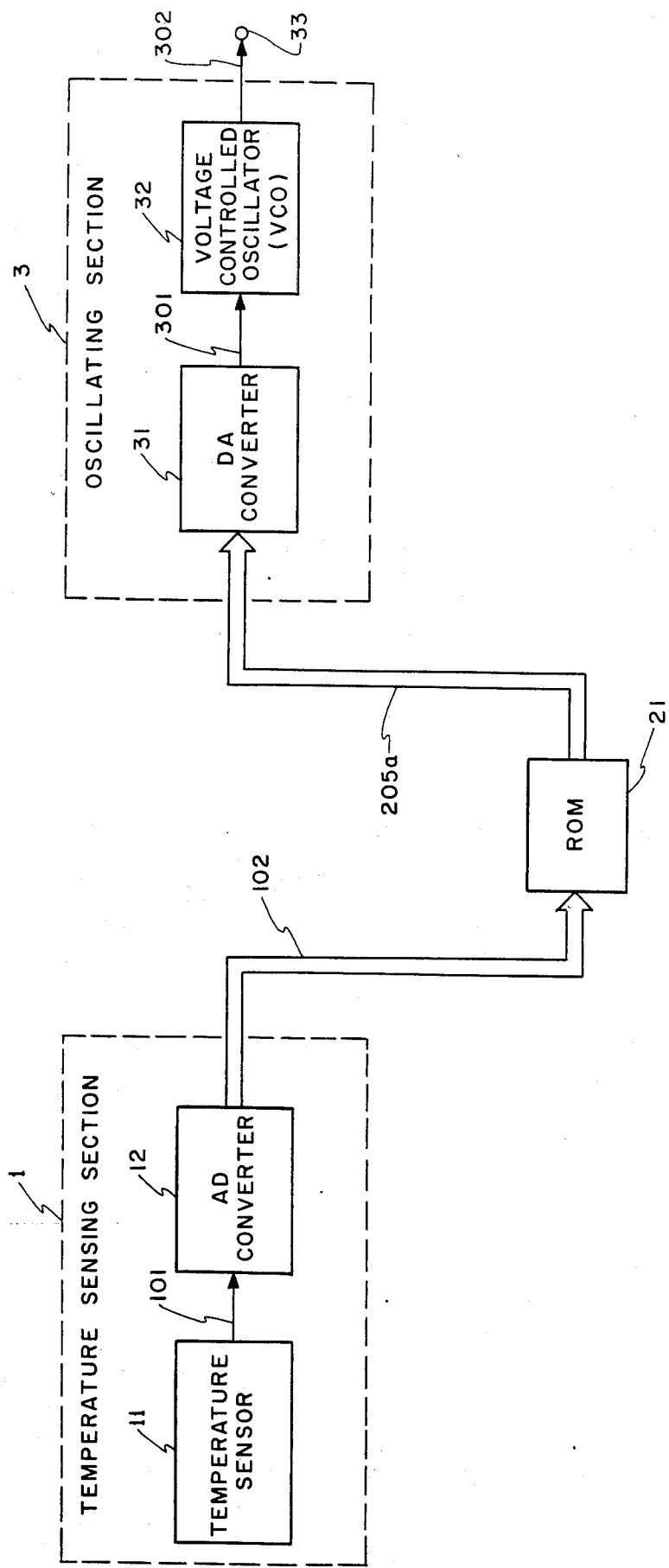
FIG. 1 is a block diagram of a prior art temperature-compensated oscillation device.

To better understand the present invention, a brief reference will be made to a prior art, digitally controlled oscillation device, shown in FIG. 1. As shown, the device comprises a temperature sensing section 1 made of a temperature sensor 11 and an analog-to-digital (AD) converter 12, a read only memory (ROM) 21, and an oscillating section 3 made of a digital-to-analog (DA) converter 31 and a voltage-controlled oscillator (VCO) 32. The VCO 32 comprises a crystal oscillator and a variable capacitance element.

The temperature sensor 11 senses an ambient temperature and converts it to a voltage which is applied as a temperature data signal on wire 101 to the AD converter 12. The AD converter 12 quantizes the input signal on wire 101 to provide a first digital value which is produced as a first digital signal applied to bus 102. This signal on bus 102 is delivered to an address input terminal of the ROM 21 to specify a particular ROM address. A second digital value which is stored at that address is outputted as a second digital signal via data bus 205a. The DA converter 31 to which the second digital signal is routed via bus 205a transforms the second digital signal into a voltage and applies that voltage as a frequency control signal via wire 301 to the VCO 32. Responsive to the signal on wire 301, the VCO 32 controls the capacitance of its variable capacitance element. As a result, there is a temperature-compensation of the frequency of an oscillation signal applied to wire 302, which is an output of the VCO 32.

Details of the temperature compensation which is effected, as described above, will be described with reference to FIGS. 2A-2C. While the frequency control signal on wire 301 is maintained at a certain constant value, the frequency of the oscillation signal at 302 may vary with the ambient temperature as shown in FIG. 2A.

Figure 2A:
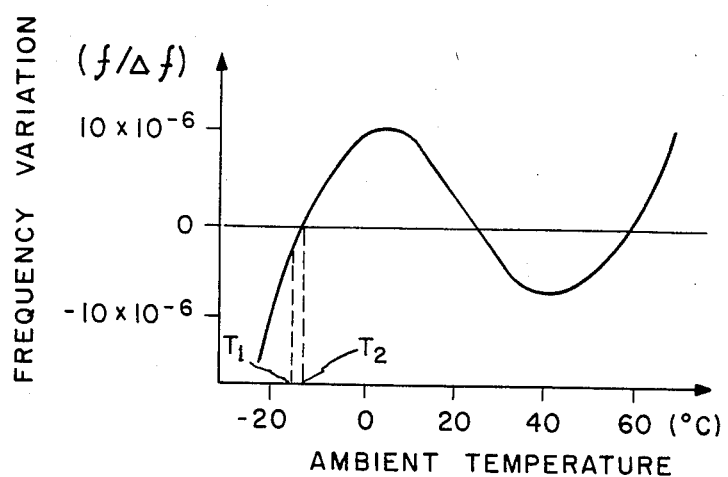
FIGS. 2A-2C are graphs representative of the operation of a voltage-controlled oscillator which is applicable to the present invention as well as to the prior art, specifically
Figure 2B:
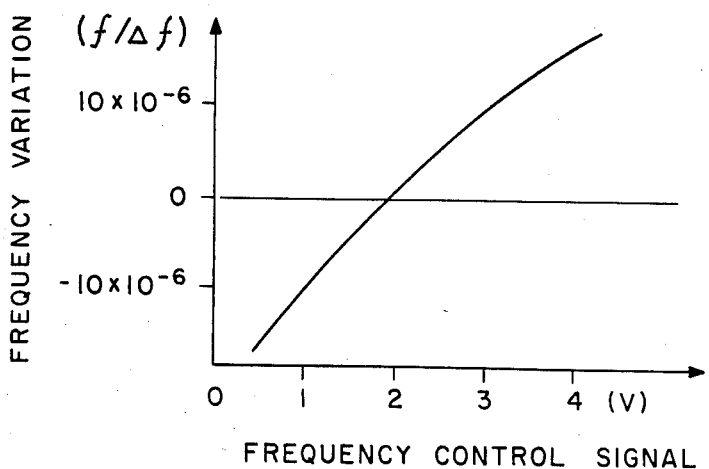
Figure 2C:
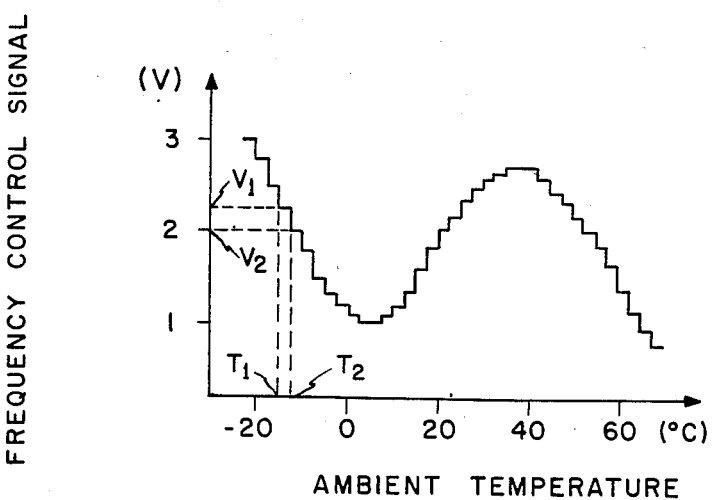

Specifically, the graph of FIG. 2A represents a relationship between the temperature surrounding the crystal oscillator of the VCO 32 and the variation of its resonance frequency. Meanwhile, when the ambient temperature remains constant, the frequency of the oscillation signal at 302 may vary with the frequency control signal appearing on wire 301, as shown in FIG. 2B. If the relationship between the first digital signal on data bus 102 and the second digital signal on data bus 205a in the ROM 21 has the relationship shown in FIG. 2C between the ambient temperature and the frequency control signal on wire 301, the frequency of the oscillation signal at 302 is temperature-compensated. A step curve is shown in FIG. 2C because the ambient temperature is quantized as the first digital signal on wire 102.

Figure 3:
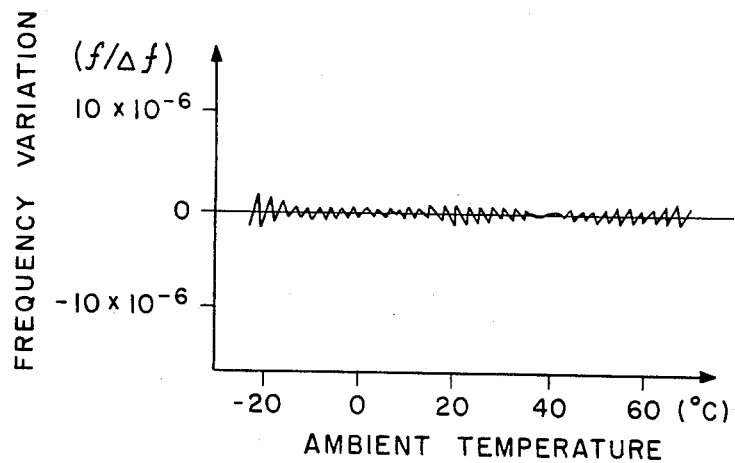
FIG. 3 is a graph showing an oscillation signal frequency variation against an ambient temperature characteristic of a prior art temperature-compensated oscillation device and against the inventive oscillation device.

FIG. 3 shows the frequency variation of the oscillation signal at 302, after temperature compensation, relative to the ambient temperature. Comparing FIG. 3 with FIG. 2A, it will be seen that as a result of temperature compensation, the frequency variation of the oscillation signal at 302 has been reduced by about one-quarter over the temperature range of $-20°$ C. to $+60°$ C.

Figure 4:
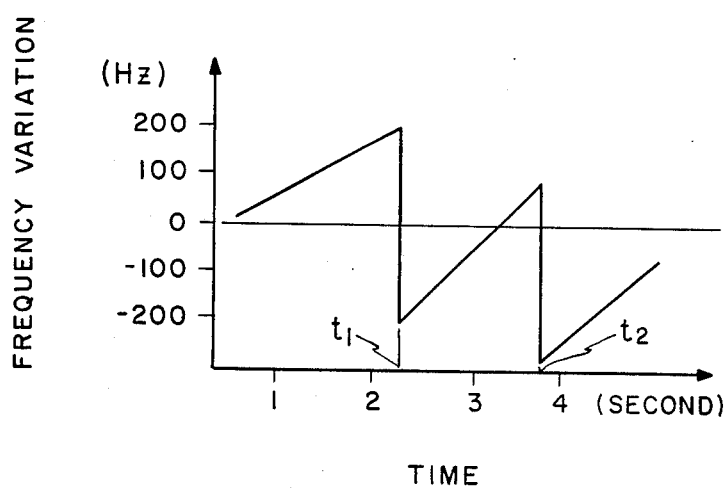
FIG. 4 is a graph showing an oscillation signal frequency variation against a time characteristic of the prior art temperature-compensated oscillation device.

FIG. 4 shows a graph which is representative of exemplary frequency variations of the oscillation signal at 302, with respect to time. These frequency variations occur while the ambient temperature is varied with time. As understood by comparing FIG. 4 with FIGS. 2A and 2C, the ambient temperature shown in FIG. 4 increases with time. A temperature $T_1$ is associated with a time $t_1$ and a temperature $T_2$ with a time $t_2$. During the period between the times $t_1$ and $t_2$, the frequency control signal on wire 301 remains at a constant voltage $V_1$ and the frequency of the oscillation signal at 302 increases with time. At the time $t_2$, the signal on wire 301 shifts from the voltage $V_1$ to a voltage $V_2$. At this moment, the frequency of the signal at 302 is sharply lowered. In this manner, at the moment when the output of the AD converter 12 is varied, the frequency of the oscillation signal at 302 is sharply varied with a result that frequency modulation noise and phase modulation noise are added to the signal at 302.

Thus, in this prior art device, there is a sufficiently small frequency variation in the digitally temperature-controlled oscillation device installed in a radio frequency or phase modulation communcation system. However, the prior art cannot avoid a substantial magnitude of noise, as previously discussed. In addition, the influence of the noise extends into other channels.

Figure 5:
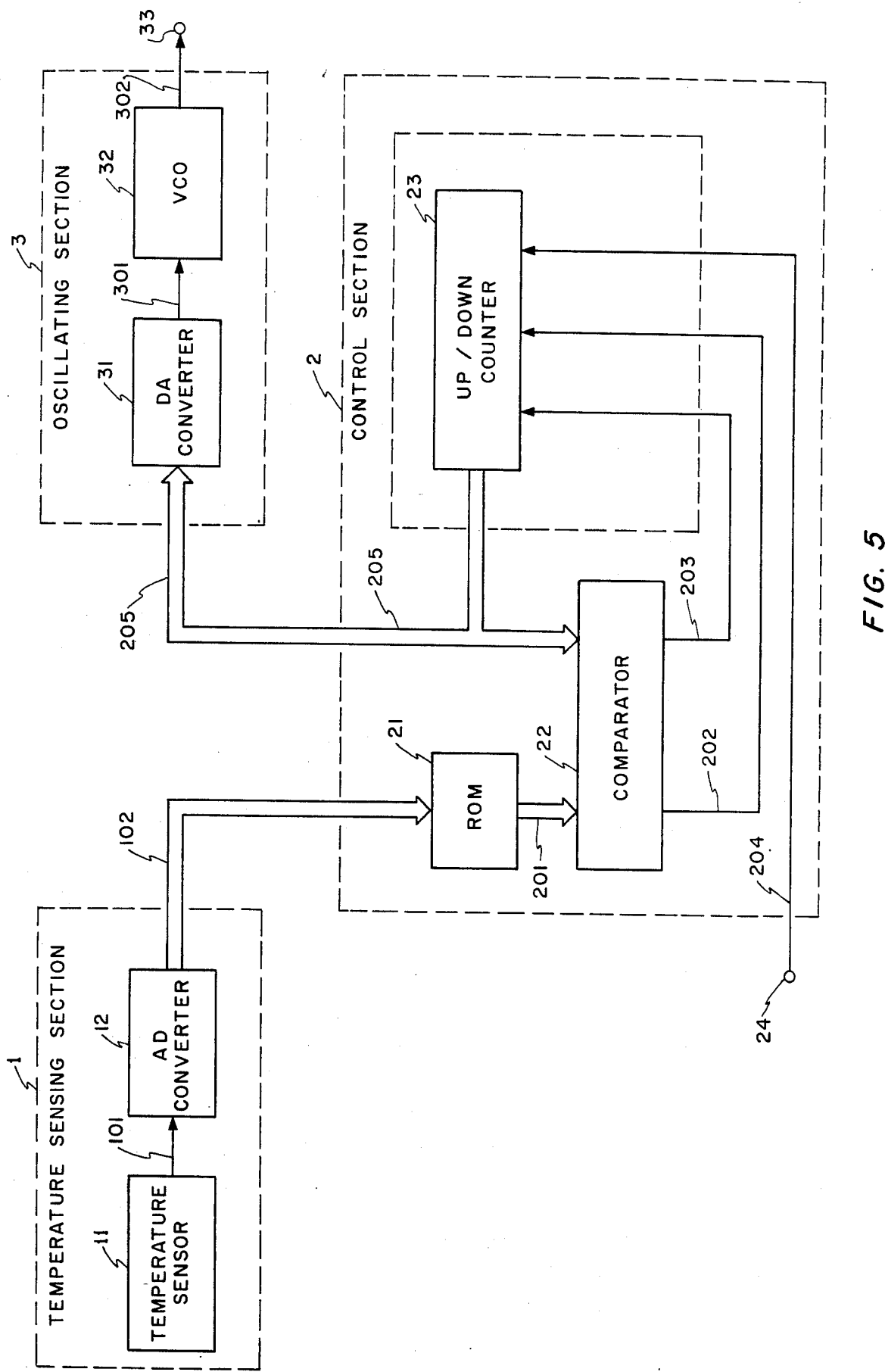
FIG. 5 is a block diagram of a temperature-compensated oscillation device embodying the present invention.

FIG. 5 shows a temperature-compensated oscillation device embodying the present invention, which is free from the drawbacks stated above. As shown, the oscillation device comprises a temperature and an AD converter 12. A control section 2 is made of a ROM 21, a comparator 22 and an up-down counter 23. An oscillating section 3, is made of a DA converter 31 and a VCO 32. The VCO 32 comprises a crystal oscillator and a variable capacitance element.

The temperature sensor 11 converts an ambient temperature into a voltage and produces the voltage as a temperature data signal at 101. Responsive to the signal at 101, the AD converter 12 quantizes it to provide a first digital value which is applied to data bus 102 as the first digital value signal to an address input terminal of the ROM 21. The ROM 21 produces a third digital value (assumed to have a value A) from a particular address thereof which is specified by the input signal on data 102, the third digital value being applied over data bus 201 to one input terminal of the comparator 22. Applied to the other input terminal of the comparator 22 is a count from the up-down counter 23 (assumed to have a value B).

The comparator 22 produces an identification signal at 202 which is a high level "1" when A=B and a low level "0" when A≠B. The comprator 22 also produces a discrimination signal at 203 which is a high level "1" when A>B and a low level "0" when A<B. The identification signal at 202 and the discrimination signal at 203 are applied to the up-down counter 23. A clock signal on wire 204 is also applied to the up-down counter 23 via a clock input terminal 24 of the control section 2.

While the identification signal at 202 is a high level, the counter 23 is disenabled to maintain the value B equal to the value A. While the identification signal at 202 is a low level and the discrimination signal at 203 is a high level, the counter 23 is incremented responsive to each pulse of the clock signal appearing on wire 204. When the identification signal at 202 is a low level and the discrimination signal at 203 is a high level, the counter 23 is decremented responsive to each pulse of the clock signal on wire 204. In this manner, the comparator 22 and the counter 23 cooperate with each other to maintain the value B equal to the value A when A=B and to increment or decrement the value B to the value A when A≠B.

The output of the counter 23 is also applied to the data bus 205 and thus to the DA converter 31. The DA converter 31 converts the input signal on bus 205 into a voltage and applies it to the VCO via wire 301 as a frequency control signal. The signal on wire 301 controls the capacitance of the variable capacitance element of the VCO 32 to temperature-compensate the frequency of an oscillation signal at 302 which is outputted from the oscillatin device.

Thus, the control section 2 converts a variation in the first digital signal appearing on data bus 102 into a plurality of time-divided fractional variations in the output of the counter 23 which appears on data bus 205.

Figure 6:
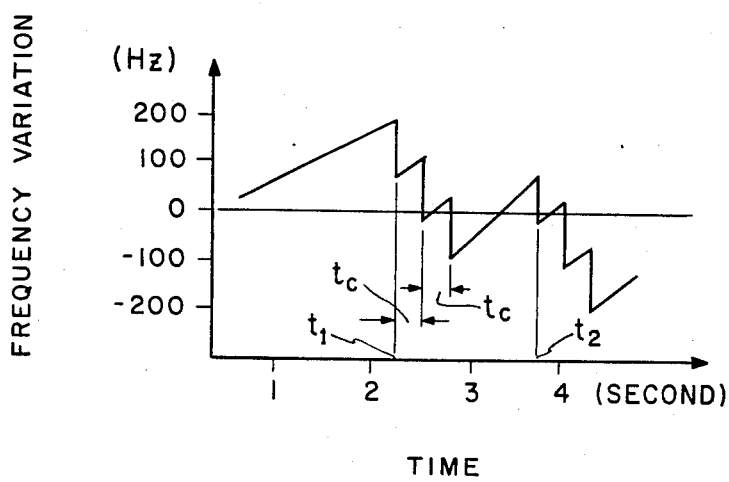
FIG. 6 is an oscillation signal frequency variation against a time characteristic which is particular to the temperature-compensated oscillation device of the present invention.

FIG. 6 shows an exemplary relationship between time and the frequency variation of the oscillatin signal at 302, in accordance with the illustrative embodiment of FIG. 5, the temperature being assumed as varying with time. Assume that a value A is associated with an ambient temperature at a time immediately before a time $t_1$ is $A_1$, and further, assume that the value $A_1$ has changed to $A_2$ at the time $t_1$. Then, the value B changes from $A_1$ to $(A_1-1)$ at the time $t_1$ to $(A_1-2)$ at a time $(t_1+t_c)$, and to $(A_1-3)$ at a time $(t_1+2t_c)$, where $t_c$ is the period of the clock signal appearing on wire 204. In the example shown in FIG. 6, $A_2$ is equal to $(A_1-3)$. As the value B is varied at the times $t_1$, $(t_1+t_c)$ and $(t_1+2t_c)$, the frequency of the oscillation signal at 302 is also varied in a stepwise manner at those times. Comparing FIG. 6 with FIG. 4, it will be apparent that the stepwise variations, i.e., the amounts of sharp variations of the frequency of the signal at 302 are smaller in the illustrative embodiment (FIG. 6) than in the prior art (FIG. 4). As a result, less noise is introduced into the signal at 302 due to the sharp frequency variations.

Figure 7:
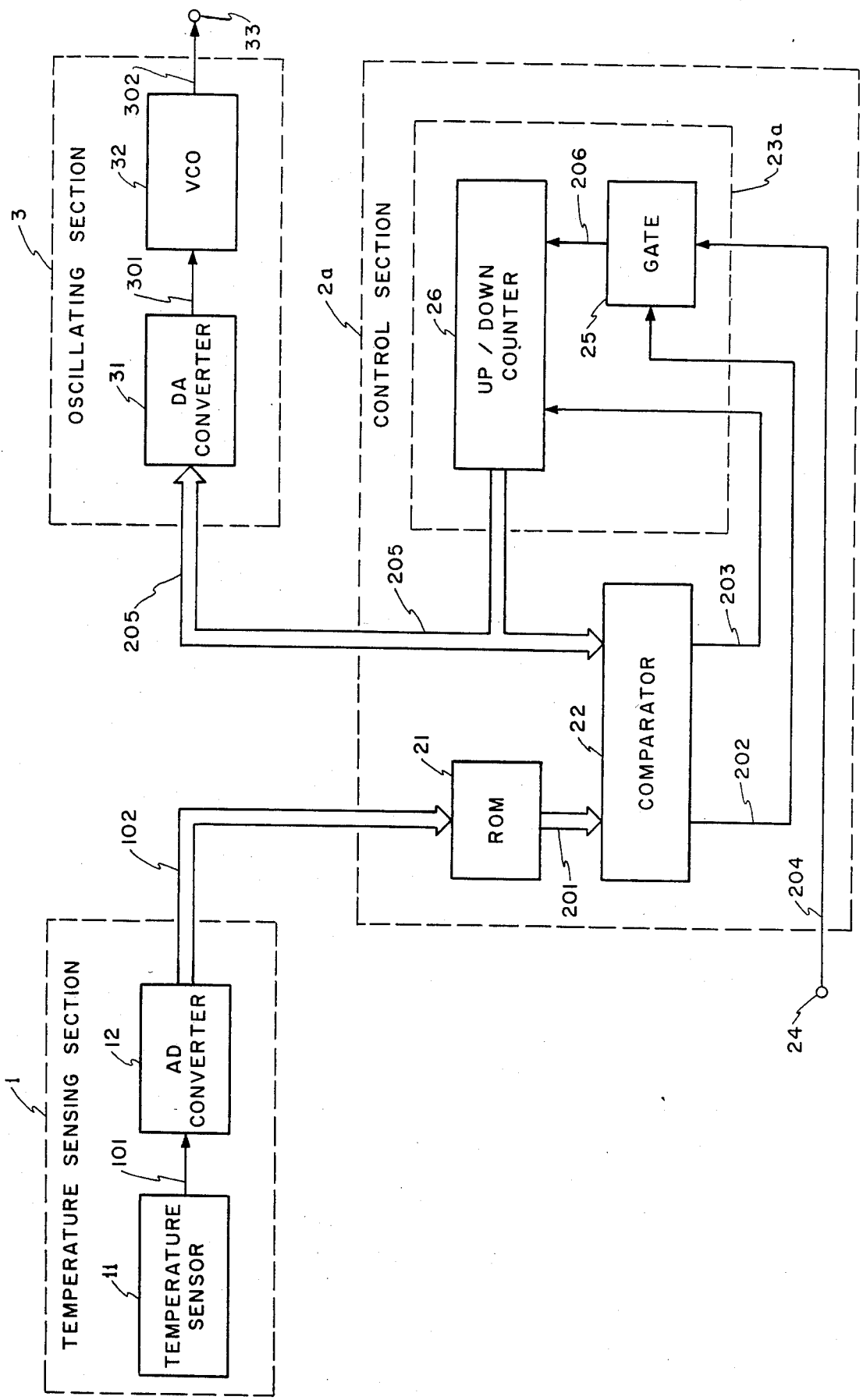
FIG. 7 is a block diagram showing another embodiment of the present invention.

FIG. 7 shows another embodiment of the present invention. The oscillation device in this particular embodiment differs from that of FIG. 5 in that the up-down counter 23 of FIG. 5 is replaced by a gate 25 and an up-down counter 26. The identification signal on wire 202 and clock signal on wire 204 are applied to the gate 25. Specifically, when the identification signal at 202 is a low level, the gate 25 is enabled to pass the clock signal 204 to the up-down counter 26, as an output signal at 206. When the signal at 202 is a high level, the gate 25 is disenabled to interrupt the supply of the clock signals at 204 to the counter 26. As labeled 23a in the drawing, the gate 25 and the counter 26 form a circuit which cooperates to fulfill the function which is assigned to the counter 23 of the first embodiment. Hence, the embodiment of FIG. 7 is the same in operation and effect as the embodiment of FIG. 5.

In summary, it will be seen that the present invention provides a temperature-compensated oscillation device which reduces the frequency variations and the noise over a wide temperature range. Hence, a radio communication apparatus which is implemented with the inventive device narrows the exclusive frequency band width, as compared to the band width required by a prior art apparatus.

Various modifications will become possible for those skilled in the art, after they have received the teachings of the present disclosure, without departing from the scope thereof. For example, ROM 21 is used in the illustrative embodiments as a numerical value conversion means for converting the first digital signal at 102 into the third digital signal at 201. However, such a function may alternatively be fulfilled by means of a memory which generates a constant of a polynominal for converting a first digital value to a second digital value, and an operation unit for operating responsive to the polynomial. Such a conversion means is disclosed in Japanese Unexamined Patent Publication (Kokai) 58-184809, for example. Further, in the illustrative embodiments, as well as in the modification mentioned above, the crystal oscillator included in the VCO 32 may be replaced with an elastic surface wave element. In addition, in all the embodiments and their modifications described, the clock signal input terminal 24 may be omitted. Instead, a clock signal generator may be added to the control section 2, in which case the output of the clock signal generator will serve as the source of the clock signal at 204.

Those who are skilled in the art will readily perceive how to modify the invention. Therefore, the appended claims are to be construed to cover all equivalent structures which fall within the true scope and spirit of the invention.

What is claimed is:

1. A temperature-compensated oscillator device comprising:
   temperature sensing section means including temperature sensor means for sensing an ambient temperature to provide a temperature data signal representative of the sensed temperature, analog-to-digital converter means for converting the temperature data signal into a first digital signal having a first variable digital value;
   control section means for converting the first digital signal into a second digital signal having a second digital value, the control section means comprising first means for converting a variation in the first digital value into a plurality of time-divided fractional variations in the second digital value; and
   oscillating section means including a converter means for converting the second digital signal into a frequency control signal, and voltage-controlled oscillator means responsive to the frequency control signal for changing the oscillation signal frequency.

2. A temperature-compensated oscillator device as claimed in claim 1, wherein said first means comprises second means responsive to the first digital signal for providing a third digital signal corresponding thereto; third means for comparing the second digital signal with the third digital signal and for providing an identification signal indicative of whether the second and third digital signals are coincident with each other and a discrimination signal indicative of which one of the second and third digital signals is greater than the other; and fourth means responsive to the identification signal, the discrimination signal and a clock signal for stopping a count of the clock signal when the identification signal indicates coincidence, and said fourth means incrementing or decrementing the count in accordance with the discrimination signal when the identification signal indicates non-coincidence, thereby providing the second digital signal.

3. A temperature-compensated oscillator device as claimed in claim 2, wherein the second means comprises a read only memory, the third means comprising a digital comparator, and the fourth means comprising an up/down counter.

4. A temperature-compensated oscillator device as claimed in claim 1, wherein said first means comprises second means responsive to the first digital signal for providing a third digital signal corresponding thereto; third means for comparing the second digital signal with the third digital signal and for providing an identification signal indicative of whether the second and third digital signals are coincident with each other and a discrimination signal indicative of which one of the second and third digital signals is greater than the other; fourth means for controlling the passing of a clock signal in response to the identification signal; and fifth means for counting the output of the fourth means in response to the discrimination signal.

5. A temperature-compensated oscillator device as claimed in claim 4, wherein the second means comprises a read only memory, the third means comprises a digital comparator, the fourth means comprises a gate circuit and the fifth means comprises an up/down counter.

6. A temperature-compensated oscillator comprising means for producing a temperature data signal responsive to sensed temperature changes, control means for converting said temperature data signal into control signals in order to compensate the temperature induced changes in the operation of said oscillator, said control signals being large enough to cause noise, means for subdividing said control signals into fractional variations which are small enough to greatly reduce said noise, said control means comprises counter means having a first output, memory means for providing a digital signal responsive to said temperature data signal, comparator means for comparing said digital signal with the first output of said counter means, a source of clock pulses for stepping said counter until said comparator means finds a parity, each step of said counter changing said control signal by an incremental amount to produce one of said fractional variations.

7. The temperature-compensated oscillator of claim 6 wherein said memory means is a read only memory means.

8. The temperature-compensated oscillator of claim 6 wherein said counter is an up/down counter which is driven bi-directionally responsive to the direction of changes in said temperature.

9. The temperature-compensated oscillator of claim 6 further comprising gate means jointly responsive to said comparator and to said source of clock pulses, and means responsive to the output of said gate for said stepping of said counter.

* * * * *